United States Patent
Dolbear

[19]

[11] Patent Number: 5,907,474
[45] Date of Patent: May 25, 1999

[54] LOW-PROFILE HEAT TRANSFER APPARATUS FOR A SURFACE-MOUNTED SEMICONDUCTOR DEVICE EMPLOYING A BALL GRID ARRAY (BGA) DEVICE PACKAGE

[75] Inventor: Thomas P. Dolbear, Austin, Tex.

[73] Assignee: Advanced Micro Devices, Inc.

[21] Appl. No.: 08/845,591

[22] Filed: Apr. 25, 1997

[51] Int. Cl.⁶ .................................................. H05K 7/20
[52] U.S. Cl. ........................................ 361/705; 174/52.4
[58] Field of Search .................................. 165/80.3, 185; 174/16.3, 252, 52.4; 257/706, 707, 712, 713, 722, 730, 731; 361/702, 704, 705, 706, 713, 722, 717–719

[56] References Cited

U.S. PATENT DOCUMENTS

| | | |
|---|---|---|
| 5,367,193 | 11/1994 | Malladl . |
| 5,396,403 | 3/1995 | Patel ........................................ 361/705 |
| 5,585,671 | 12/1996 | Nagesh . |
| 5,710,459 | 1/1998 | Teng ........................................ 361/719 |

FOREIGN PATENT DOCUMENTS

| | | | |
|---|---|---|---|
| 405160588 | 6/1993 | Japan ..................................... 361/719 |

OTHER PUBLICATIONS

IBM Tech Discl Bull vol. 22 No. 6 Nov. 1979 p. 2294 Structure . . . Module (Arnold).

*Primary Examiner*—Gerald Tolin
*Attorney, Agent, or Firm*—Kevin L. Daffer; Conley, Rose & Tayon

[57] ABSTRACT

A low-profile heat transfer apparatus is presented for a surface-mounted semiconductor device employing a ball grid array (BGA) device package having a chip mounted upon a substantially flat upper surface of a substrate. The semiconductor device is mounted upon a component side of a printed circuit board (PCB), and the heat transfer apparatus is used to transfer heat energy from the semiconductor device to an ambient. A thermally conductive cap structure is positioned between the semiconductor device and the ambient. The cap structure includes a bottom surface having a first cavity sized to receive the substrate and possibly any decoupling capacitors. During use, the substrate resides within the first cavity. In a first embodiment, the chip resides within a second cavity in an upper wall of the first cavity during use. The chip and substrate are thermally coupled to the cap structure by a first and second thermal interface layer, respectively. The use of two thermal interface layers achieves a relatively low value of $\theta_{JS}$, allowing the cap structure to remain relatively small. In a second embodiment, the chip resides within a hole in the cap structure during use such that the upper surface of the chip is exposed to the ambient. The substrate is thermally coupled to the cap structure by a thermal interface layer. The achieved value of $\theta_{JS}$ is acceptably low for some applications, and the height of the cap structure relative to the component side of the PCB is substantially reduced.

25 Claims, 4 Drawing Sheets

LOW-PROFILE HEAT TRANSFER APPARATUS FOR A SURFACE-MOUNTED SEMICONDUCTOR DEVICE EMPLOYING A BALL GRID ARRAY (BGA) DEVICE PACKAGE

BACKGROUND OF THE INVENTION

1. Field of the Invention

This invention relates to the manufacture of electronic systems, and more particularly to devices used to transfer heat energy produced by a semiconductor device to an ambient.

2. Description of the Relevant Art

During manufacture of an integrated circuit (e.g., a microprocessor), signal lines formed upon the silicon substrate which are to be connected to external devices are terminated at flat metal contact regions called input/output (I/O) pads. Following manufacture, the integrated circuit is typically secured within a protective semiconductor device package. Each I/O pad of the chip is then connected to one or more terminals of the device package. The terminals of a device packages are typically arranged about the periphery of the package. Fine metal wires are typically used to connect the I/O pads of the chip to the terminals of the device package. Some types of device packages have terminals called "pins" for insertion into holes in a printed circuit board (PCB). Other types of device packages have terminals called "leads" for attachment to flat metal contact regions on an exposed surface of a PCB.

As integrated circuit fabrication technology improves, manufacturers are able to integrate more and more functions onto single silicon substrates. As the number of functions on a single chip increases, however, the number of signal lines which need to be connected to external devices also increases. The corresponding numbers of required I/O pads and device package terminals increase as well, as do the complexities and costs of the device packages. Constraints of high-volume PCB assembly operations place lower limits on the physical dimensions of and distances between device package terminals. As a result, the areas of peripheral-terminal device packages having hundreds of terminals are largely proportional to the number of terminals. These larger packages with fine-pitch leads are subject to mechanical damage during handling or testing. Mishandling can result in a loss of lead coplanarity, adversely affecting PCB assembly yields. In addition, the lengths of signal lines from chip I/O pads to device package terminals increase with the number of terminals, and the high-frequency electrical performance of larger peripheral-terminal device packages suffer as a result.

Grid array semiconductor device packages, on the other hand, have terminals arranged as an array across the underside surface of the device package. As a result, the physical dimensions of grid array device packages having hundreds of terminals are much smaller than their peripheral-terminal counterparts. Such smaller packages are highly desirable in portable device applications such as laptop and palmtop computers and hand-held communications devices such as cellular telephones. In addition, the lengths of signal lines from chip I/O pads to device package terminals are shorter, thus the high-frequency electrical performances of grid array device packages are typically better than those of corresponding peripheral-terminal device packages. Grid array device packages also allow the continued use of existing PCB assembly equipment developed for peripheral-terminal devices.

An increasingly popular type of grid array device package is the ball grid array (BGA) device package. A BGA device includes a chip mounted upon a larger substrate made of, for example, fiberglass-epoxy printed circuit board material or a ceramic material (e.g., aluminum oxide, alumina, $Al_2O_3$, or aluminum nitride, AlN). The substrate includes two sets of bonding pads: a first set adjacent to the chip and a second set arranged as an array across the underside surface of the device package. Members of the second set of bonding pads function as device package terminals, and are coated with solder. The resulting solder "balls" on the underside of the BGA device package allow the device to be surface mounted to an ordinary PCB. The I/O pads of the chip are connected to corresponding members of the first set of bonding pads by signal lines (e.g., fine metal wires). The substrate includes one or more layers of signal lines (i.e., interconnects) which connect respective members of the first and second sets of bonding pads.

During PCB assembly, the solder-covered bonding pads of a BGA device package are placed in physical contact with corresponding bonding pads of a PCB. In some cases, the solder-covered bonding pads of the BGA device package are then heated long enough for the solder to flow. In other cases, the bonding pads of the PCB are coated with solder which melts at a lower temperature than that of the solder balls, and the bonding pads of the PCB are heated long enough for the solder thereupon to flow. In either case, when the solder cools, the bonding pads on the underside of the BGA device package are electrically and mechanically coupled to the corresponding bonding pads of the PCB.

Semiconductor devices (e.g., integrated circuits) dissipate electrical power during operation, transforming electrical energy into heat energy. At the same time, several key operating parameters of a semiconductor device typically vary with temperature, and reliable device operation within specifications occurs only within a defined operating temperature range. For high performance devices, such as microprocessors, specified performance is only achieved when the temperature of the device is below a specified maximum operating temperature. Operation of the device at a temperature above an upper limit of the operating temperature range, or above the maximum operating temperature, may result in irreversible damage to the device. In addition, it has been established that the reliability of a semiconductor device decreases with increasing operating temperature. The heat energy produced by a semiconductor device during operation must thus be removed to the ambient environment at a rate which ensures operational and reliability requirements are met. Some of the heat energy produced by an integrated circuit device flows from I/O pads to the PCB through the signal lines within the device package and the device package terminals.

The operating temperature of a chip enclosed within a device package is governed by: (i) the temperature of the ambient surrounding the device package, (ii) the amount of electrical power dissipated by the chip, and (iii) the sum of thermal resistances of elements and interfaces along the a heat transfer path from the chip to the ambient:

$T_J = T_A + P_D \cdot \theta_{JA}$, where $T_J$=average junction (i.e., chip) temperature (°C.), $T_A$=ambient temperature (°C.), $P_D$=chip power dissipation (W), and $\theta_{JA}$=sum of thermal resistances of elements and interfaces along the heat transfer path from the chip to the ambient (°C./W)

Proper thermal design of an electronic system involves influencing the values of $\theta_{JA}$ for each integrated circuit device such that the average temperature of the chip, $T_J$, does not exceed a maximum value, $T_{J(MAX)}$. $T_{J(MAX)}$ is specified by the device manufacturer to meet operational and reliability requirements as described above.

For example, in the case of an integrated circuit device relying on direct exposure to the ambient (i.e., natural convection) for cooling, most of the heat energy produced by the chip must flow through the device package (by conduction) and through the interface between the surface of the device package and the ambient (principally by convection) to reach the ambient. The value of $\theta_{JA}$ is given by:

$$\theta_{JA} = \theta_{JC} + \theta_{CA}$$

where $\theta_{JC}$ is the thermal resistance of the device package (i.e., the junction-to-case thermal resistance value) and $\theta_{CA}$ is the thermal resistance of the interface between the surface of the device package and the ambient (i.e., the case-to-ambient thermal resistance value). Integrated circuit device manufacturers typically specify conservative values of $\theta_{JC}$ and $\theta_{CA}$ for their products. In order to keep the temperature of the chip below $T_{J(MAX)}$, the maximum power which may safely be dissipated by the device is dependent upon the temperature of the ambient.

More complex heat transfer (i.e., cooling) mechanisms, such as heat sinks and forced air cooling, permit semiconductor devices to dissipate more electrical power than direct exposure to the ambient would otherwise allow. For example, consider an integrated circuit employing a heat sink attached to one or more external surfaces of the device package for increased heat transfer capability. Most of the heat energy produced by the chip must flow through the device package (by conduction), through the interface between adjoining surfaces of the device package and the heat sink (by conduction) and through the interface between the heat sink and the ambient (principally by convection) to reach the ambient. The value of $\theta_{JA}$ is given by:

$$\theta_{JA} = \theta_{JC} + \theta_{CS} + \theta_{SA}$$

where $\theta_{JC}$ is the junction-to-case thermal resistance value, $\theta_{CS}$ is thermal resistance of the interface between the adjoining surfaces of the device package and the heat sink (i.e., the case-to-sink thermal resistance value), and $\theta_{SA}$ is the thermal resistance of the interface between the surface of the heat sink and the ambient (i.e., the sink-to-ambient thermal resistance value). Heat sink manufacturers typically specify conservative values of $\theta_{CS}$ and $\theta_{SA}$ for various means of coupling their products to standard device packages. The sum of $\theta_{CS}$ and $\theta_{SA}$ is typically less than $\theta_{CA}$ (for the device package in natural convection and without a heat sink), permitting the integrated circuit device to dissipate more electrical power than direct exposure to the ambient would otherwise allow while keeping the temperature of the chip below $T_{J(MAX)}$.

The mating surfaces of device packages and heat sinks are not perfectly flat or smooth, consisting of microscopic peaks and valleys. When the mating surfaces of a device package and a heat sink are brought into direct contact, air gaps exist over a large fraction of the total mating surface area. These air gaps contribute little to the conduction of heat from the device package to the heat sink. The value of $\theta_{CS}$ is typically lowered substantially by filling the air gaps with a thermal interface material which conducts heat more readily than air. Common thermal interface materials include thermal greases and elastomeric pads containing thermally conductive ceramic particles (e.g., particles of boron nitride, aluminum oxide, or magnesium oxide). Plastic or metal clips anchored under the edges of grid array device packages or within sockets designed to receive pin grid array (PGA) device packages may be used to couple heat sinks to grid array device packages. When engaged, the clips apply pressure between grid array device packages and heat sinks. Alternately, metal hooks anchored in the PCB may be used to clamp heat sinks to grid array device packages. Such clips and hooks advantageously allow the heat sinks and device packages to be replaced separately. The applied pressure reduces the overall thickness of the thermal interface material while causing the thermal interface material to fill more of the air gaps, thus reducing $\theta_{CS}$. In general, the higher the pressure applied between the device package and the heat sink, the lower the value of $\theta_{CS}$. Heat sink clips and clamps are typically designed to apply a force of 10 pounds or less between grid array device packages and heat sinks.

Problems arise when the conventional thermal management techniques described above are applied to BGA device packages. A BGA device package has no socket in which to anchor heat sink fasteners (i.e., bolts or clips). As a result, heat sinks attached to BGA device packages are anchored either in the PCB or under edges of the BGA device package. Heat sink clamps anchored to the PCB are preferable to clips anchored under the edges of a BGA device package, especially when an electronic system including the BGA device package is expected to be subjected to mechanical shock and vibration (i.e., in portable applications).

It is noted that BGA device packages have no "case" as such, and the value of $\theta_{JA}$ for a BGA device package is given by:

$$\theta_{JA} = \theta_{JS} + \theta_{SA}$$

where $\theta_{JS}$ is the junction-to-sink thermal resistance value and $\theta_{SA}$ is the thermal resistance of the interface between the surface of the heat sink and the ambient (i.e., the sink-to-ambient thermal resistance value). The upper surface of a BGA device package is not, unfortunately, always parallel to the surface of the component side of the PCB to which the BGA device package is mounted. Manufacturing variations result in elevational disparity across the upper surface of the BGA device package as referenced from the component side of the PCB. In other words, the upper surface of the BGA device package is sloped or "tilted" in relation to the surface of the component side of the PCB, and in relation to the bottom surface of a heat sink anchored in the PCB. This slope or "tilt" between the bottom surface of the heat sink and the upper surface of the BGA device package is typically accommodated by a layer of a pliable thermal interface material at the expense of an increase in the value of $\theta_{JS}$. Achieving acceptably low values of $\theta_{JS}$ with a pliable thermal interface layer requires that a certain amount of pressure be continuously applied between the heat sink and the BGA device package. Reliability concerns due to movement of the solder balls over time (i.e., creep) limit the amount of pressure which may be applied between the heat sink and the BGA device package. The resulting reduced pressure further increases the value of $\theta_{JS}$. A conservative design approach requires a larger and more expensive cooling mechanism than would otherwise be necessary. The resulting increases in heat sink size and cost are highly undesirable, especially in portable applications.

A typical example involving a semiconductor device employing a ceramic BGA device package will now be described to illustrate the BGA device package thermal management problem. FIG. 1a is a side elevation view of a semiconductor device 10 employing a BGA device package mounted upon a component side of a PCB 12. Semiconductor device 10 includes one or more electronic devices formed upon a monolithic semiconductor substrate (i.e., chip) 14. Semiconductor device 10 also includes a substrate 16 substantially made of, for example, fiberglass-epoxy printed circuit board material or a ceramic material as described above. I/O pads on an underside of chip 14 are connected to corresponding members of a first set of bonding pads on an upper surface of substrate 16 using the well known controlled collapse chip connection (C4) method, commonly known as the "flip chip" method. The C4 connections are made in region 18 between chip 14 and substrate 16. After chip 14 is mounted upon substrate 16, region 18 is filled with an "underfill" material which seals the C4 connections and provides other mechanical advantages.

During PCB assembly, solder balls 20 formed upon a second set of bonding pads on an underside of substrate 16 are placed in physical contact with a corresponding set of bonding pads on the component side of PCB 12. Solder balls 20 may then be heated long enough for the solder to flow. Alternately, the bonding pads of PCB 12 may be coated with solder which melts at a lower temperature than that of solder balls 20, and the bonding pads of PCB 12 may be heated long enough for the solder thereupon to flow. In either case, when the solder cools, the second set of bonding pads of substrate 16 are electrically and mechanically coupled to the corresponding bonding pads of PCB 12.

Due to manufacturing variations, the elevations at opposite sides of chip 14 relative to the surface of the component side of PCB 12 (i.e., heights 22 and 24) may vary substantially. For a ceramic BGA package, the heights of solder balls 20 may vary about ±0.1 millimeter (mm). The thickness of substrate 16 may vary about ±10 percent (e.g., ±0.175 mm for a substrate 1.75 mm thick). The heights of C4 connections made in region 18 may vary by about ±0.016 mm, and the thickness if chip 14 may vary by about ±0.050 mm. Using a root-sum-of-squares combination of these tolerances, heights 22 and 24 may vary by, for example, about 0.2 mm. In addition, the upper surface of chip 14 is typically not parallel to the surface of the component side PCB 12, and slope 26 of the upper surface of chip 14 relative to the surface of PCB 12 may be, for example, as much as 0.006 inches of elevation per inch of distance parallel to the component side of PCB 12.

FIG. 1b is a side elevation view of a typical heat sink 28 mounted upon semiconductor device 10 of FIG. 1a. Heat sink 28 includes two clips 29a–b anchored in PCB 12. Clips 29a–b apply a force between heat sink 28 and semiconductor device 10 which urges heat sink 28 toward semiconductor device 10. A layer of a pliable thermal interface material 30 is positioned between an upper surface of chip 14 and a bottom surface of heat sink 28. Thermal interface layer 30 thermally couples heat sink 28 to chip 14. Thermal interface layer 30 is typically a piece of thermally conductive elastomer (e.g., thermal interface tape or a thermal interface pad).

Clips 29a–b continuously apply a substantially constant amount of force between heat sink 28 and semiconductor device 10, creating a pressure across thermal interface layer 30 in order to achieve an acceptably low value of $\theta_{JS}$. Any elevational disparity between the upper surface of semiconductor 10 and the surface of the component side of PCB 12 causes the pressure exerted across thermal interface layer 32 to be non-uniform and increases the achieved value of $\theta_{JS}$. A conservative design approach requires that a larger and more expensive heat sink with a lower value of $\theta_{SA}$ be installed to compensate for the increase in $\theta_{JS}$.

In order to reduce $\theta_{SA}$, heat sink 28 typically includes multiple fins or pins 31 which increase the heat transfer capability of heat sink 28. Unfortunately, fins or pins 31 also increase the total volume occupied by heat sink 28 as well as height 32 of heat sink 28 relative to the component side of PCB 12. Fins or pins 31 also add to the cost of heat sink 28.

A portion of the force applied between heat sink 28 and semiconductor device 10 is transmitted through chip 14 and substrate 16 to solder balls 20. Solder balls 20 are thus subjected to a substantially constant force, resulting in mechanical stress within solder balls 20. During operation of chip 14, solder balls 20 are subjected to sufficient heat energy that a phenomenon called "creep" occurs. Mechanical creep is the permanent deformation of a material subjected to stress and temperatures greater than about one-third the melting temperature of the material. As a result of creep, solder balls 20 may cease to form low-resistance electrical connections between the bonding pads on the underside of substrate 16 and the corresponding set of bonding pads on the component side of PCB 12. The constant pressure applied between heat sink 28 and semiconductor device 10 by clips 29a–b thus represents a long term reliability concern.

It would be beneficial to have a semiconductor device heat transfer apparatus which: (i) is capable of operating when the semiconductor device is expected to be subjected to mechanical shock and vibration (i.e., in portable applications), (ii) does not adversely affect system reliability, and (iii) is relatively small and inexpensive. In order to isolate the semiconductor device from shock and vibration, a heat transfer apparatus is desirable which employs a thermally conductive cap structure which is thermally coupled to the semiconductor device but mechanically isolated from the semiconductor device. The cap structure would be positioned between an upper surface of the semiconductor device and the ambient. In order to prevent an adverse impact on system reliability, a heat transfer apparatus is desirable which uses a thermal interface layer which requires little or no pressure between the cap structure and the upper surface of the semiconductor device in order to achieve an acceptably low value of $\theta_{JS}$. The use of little or no pressure would reduce the mechanical stress created within the electrical connections between the semiconductor device package and the PCB (e.g., solder balls of a BGA device package). The ability to achieve an acceptably low value of $\theta_{JS}$ would allow the heat transfer apparatus to be relatively small and inexpensive.

SUMMARY OF THE INVENTION

The problems outlined above are in large part solved by a low-profile heat transfer apparatus for a surface-mounted semiconductor device employing a ball grid array (BGA) device package having a chip mounted upon a substantially flat upper surface of a substrate. The semiconductor device is mounted upon a component side of a printed circuit board (PCB). The heat transfer apparatus is used to transfer heat energy from the semiconductor device to an ambient surrounding the heat transfer apparatus. The heat transfer apparatus includes a thermally conductive cap structure positioned between the semiconductor device and the ambient. The cap structure includes a bottom surface having a first cavity and a circumferential lip surrounding the cavity. The first cavity comprises a substantially flat upper wall (i.e., ceiling). The first cavity is sized to receive the substrate and any decoupling capacitors associated with the semiconductor device. During use, the substrate and any decoupling capacitors reside within the first cavity, and the upper wall of the first cavity is in close proximity to the upper surface of the substrate.

In a first embodiment, a second cavity exists in the upper wall of the first cavity, and the chip of the semiconductor device resides within the second cavity during use. A substantially flat upper wall of the second cavity is in close proximity to a substantially flat upper surface of the chip during use. The chip is thermally coupled to the cap structure by a first thermal interface layer, and the substrate is thermally coupled to the cap structure by a second thermal interface layer. The first and second thermal interface layers preferably include thermally conductive particles suspended in a wax base. By thermally coupling both the chip and the substrate of the semiconductor device to the cap structure, the achieved value of thermal resistance between the semiconductor device and the cap structure (i.e., $\theta_{JS}$) is substantially reduced as compared to thermally coupling only the chip to the cap structure. As a result, the thermal resistance between the cap structure and the ambient (i.e., $\theta_{SA}$) may be increased while achieving a desired value of thermal resistance between the semiconductor device and the ambient. The cap structure may thus remain relatively small and inexpensive. The height of the cap structure relative to the component side of the PCB is substantially reduced over typical heat sinks, which is advantageous in portable applications where small and lightweight electronic systems are highly desirable. Height reductions of between 30 and 50 percent over typical heat sink applications are estimated.

In a second embodiment, a hole exists in the cap structure between the upper wall of the first cavity and a top surface of the cap structure, and the chip of the semiconductor device resides within the hole during use such that the upper surface of the chip is exposed to the ambient. The substrate is thermally coupled to the cap structure by a thermal interface layer which preferably includes thermally conductive particles suspended in a wax base. The achieved value of thermal resistance between the semiconductor device and the cap structure (i.e., $\theta_{JS}$) is acceptably low for some applications, and the height of the cap structure relative to the component side of the PCB is substantially reduced over the first embodiment described above and typical heat sinks.

During installation of the heat transfer apparatus, a force is used to bias the cap structure toward the semiconductor device in order to achieve an acceptably low thermal resistance value (i.e., $\theta_{JS}$) between the semiconductor device and the cap structure. Following application of the force, the position of the cap structure relative to the semiconductor device is fixed such that the space formed between the cap structure and the semiconductor device is maintained during use. The semiconductor device package may include, for example, solder balls on an underside surface. The solder balls are subjected to a portion of the force during installation resulting in mechanical stress within the solder balls. Once the position of the cap structure is permanently fixed relative to the semiconductor device, the solder balls undergo a process known as "stress relaxation". The term "stress relaxation" as used herein describes the reduction of mechanical stress in viscoplastic materials (e.g., solder) with time when the materials are in a state of plastic (i.e., permanent) deformation. Fixing the position of the cap structure relative to the semiconductor device promotes stress relaxation within the solder balls. As a result of this stress relaxation, the problem of creep-related solder ball failure is substantially reduced, and overall system reliability is increased.

The heat transfer apparatus also preferably includes a backing plate positioned on a side of the PCB opposite the component side and at a location opposite that of the semiconductor device during use. The backing plate provides structural support for the PCB, preventing the PCB from bowing under pressure resulting from the force used to bias the cap structure toward the semiconductor device. The backing plate is preferably made of a thermally conductive material (e.g., aluminum) and thermally coupled to the PCB in order to allow the backing plate to provide an additional heat transfer path from the semiconductor device to the ambient.

Several fasteners are preferably used to attach the backing plate to the cap structure. A portion of the fasteners are used to exert a force between the cap structure and the backing plate, urging the cap structure toward the semiconductor device during installation. The remaining fasteners are used to fix the relative positions of the backing plate and the cap structure.

The heat transfer apparatus also preferably includes a third thermal interface layer positioned between the PCB and the backing plate which thermally couples the PCB to the backing plate during use. The third thermal interface layer preferably includes thermally conductive particles in an elastomeric material.

The heat transfer apparatus also includes a seal positioned between the lip surrounding the first cavity and the PCB. The seal is used to prevent foreign substances (e.g., water, sand, and dust) from entering the cavity during use, and is preferably made of an elastomeric compound.

The heat transfer apparatus employs a thermally conductive cap structure mechanically isolated from the semiconductor device, protecting the semiconductor device from damage due to shock and vibration. In the first embodiment, two thermal interface layers positioned between the semiconductor device and the cap structure are used to achieve a relatively low value of $\theta_{JS}$, allowing the cap structure to remain relatively small and inexpensive. The second embodiment employs a single thermal interface layer between the substrate and the cap structure in order to reduce the height of the cap structure relative to the component side of the PCB. As described above, the heat transfer apparatus preferably employs thermal interface layers which require a relatively small amount of pressure between the cap structure and the upper surface of the semiconductor device in order to prevent an adverse impact on system reliability.

BRIEF DESCRIPTION OF THE DRAWINGS

Other objects and advantages of the invention will become apparent upon reading the following detailed description and upon reference to the accompanying drawings in which:

FIG. 1b is a side elevation view of a heat sink mounted upon the semiconductor device of FIG. 1a;

Figure 1A:
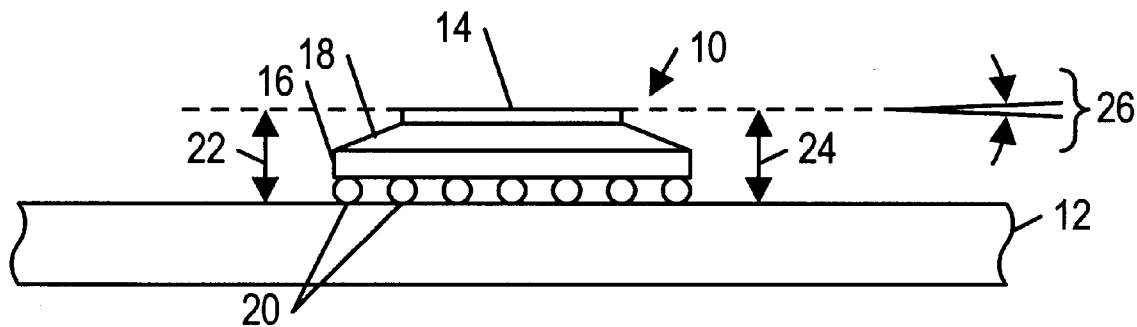
FIG. 1a is a side elevation view of a semiconductor device employing a BGA device package and mounted upon a component side of a printed circuit board (PCB)
Figure 1B:
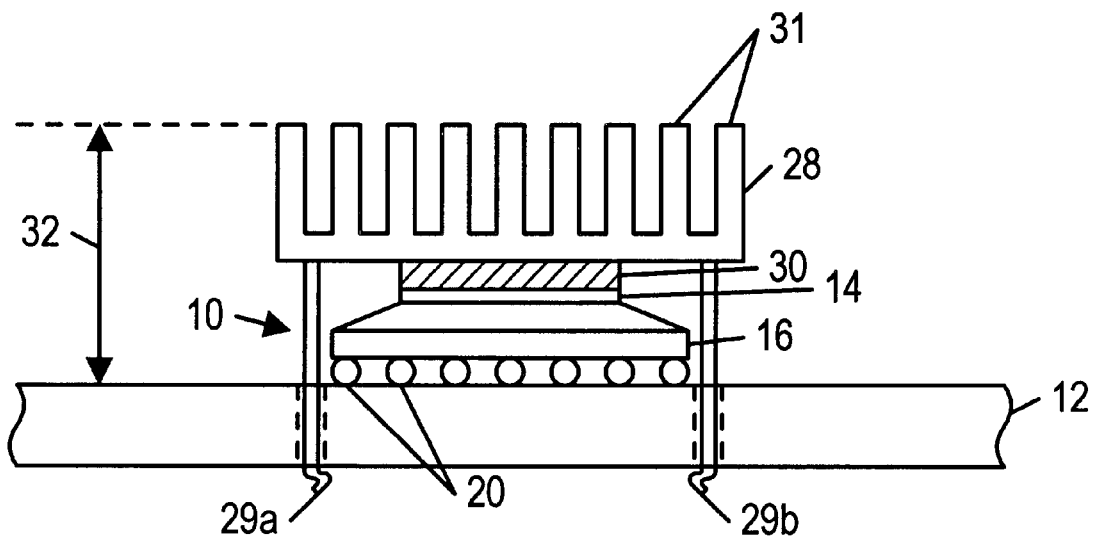

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 2:
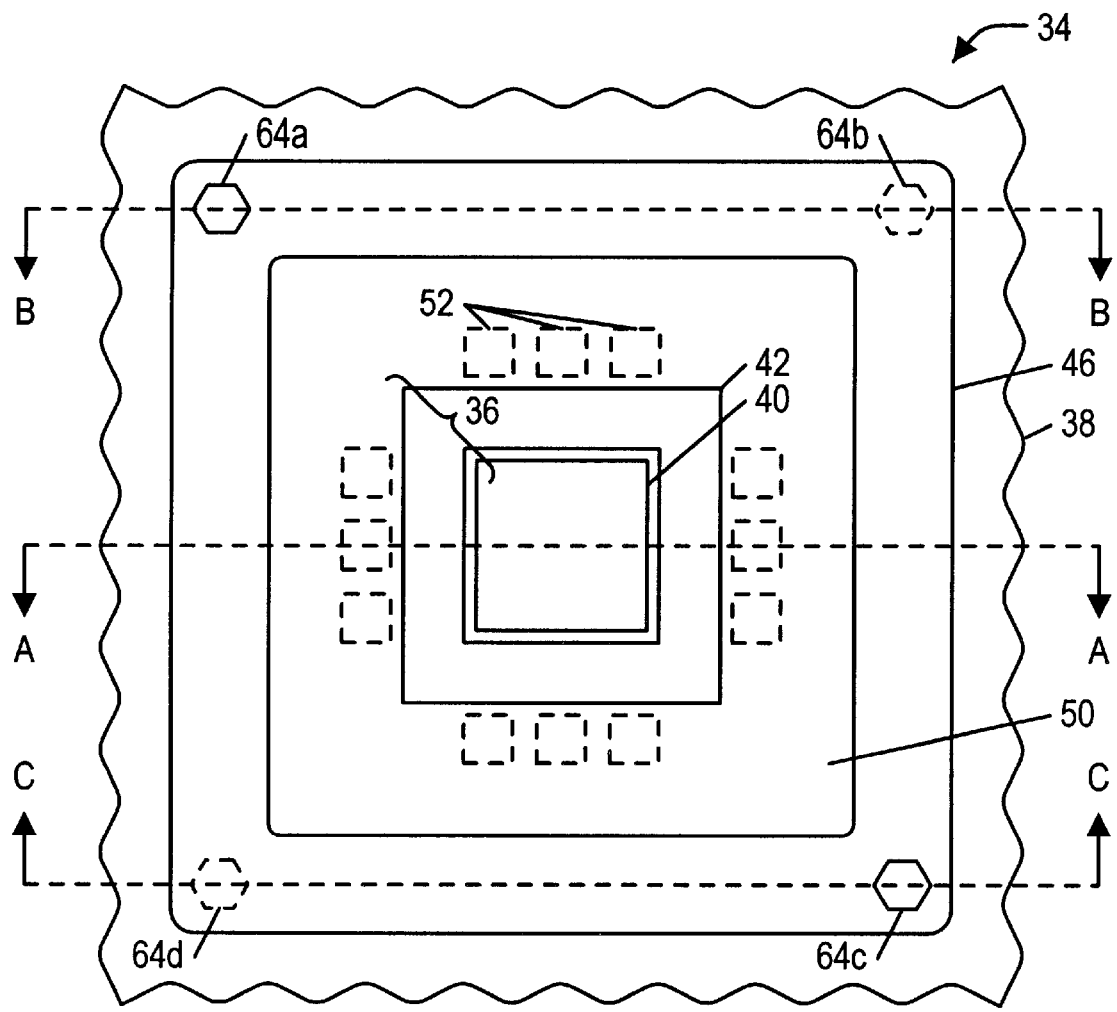
FIG. 2 is a top plan view of the heat transfer apparatus of the present invention during use, wherein the heat transfer apparatus includes a cap structure thermally coupled to a semiconductor device, and wherein the semiconductor device includes a chip mounted upon a substantially flat upper surface of a substrate, and wherein four bolts attach the cap structure to a backing plate.
Figure 3:
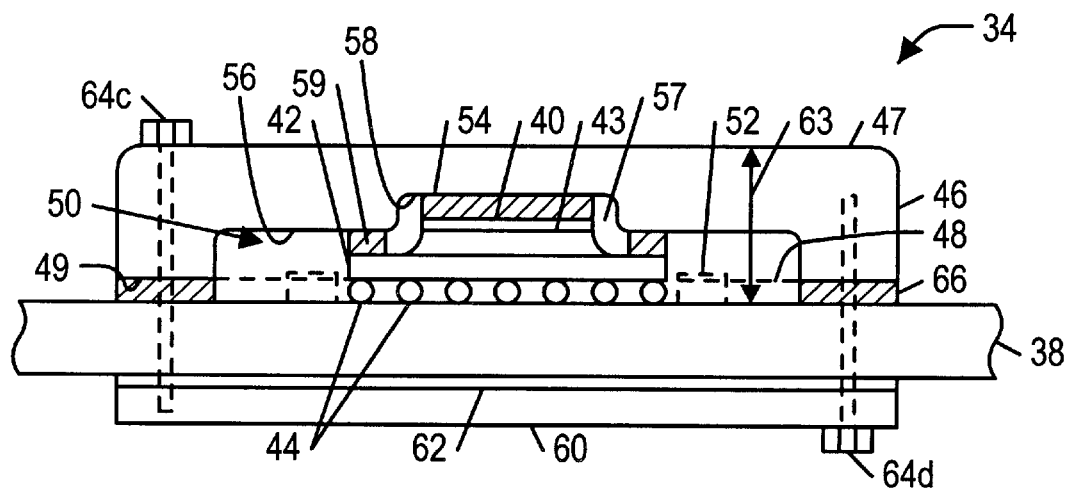
FIG. 3 is a cross-sectional view of a first embodiment of the heat transfer apparatus as viewed along cut line A—A in the direction indicated in FIG. 2, wherein the chip and the substrate of the semiconductor device are both thermally coupled to the cap structure by thermal interface layers.

FIGS. 2 and 3 will now be used to describe a first embodiment of a heat transfer apparatus 34 of the present invention. FIG. 2 is a top plan view of heat transfer apparatus 34, and FIG. 3 is a cross-sectional view of the first embodiment of heat transfer apparatus 34 as viewed along cut line A—A in the direction indicated in FIG. 2. Heat transfer apparatus 34 is designed to transfer heat energy produced by semiconductor device 36 to an ambient surrounding heat transfer apparatus 34. Semiconductor device 36 is mounted upon a component side of a printed circuit board (PCB) 38. Semiconductor device 36 employs a BGA device package, and includes a chip 40 mounted upon a substantially flat upper surface of substrate 42. An upper surface of chip 40 is at a higher elevation relative to the upper surface of substrate 42. Chip 40 is a monolithic semiconductor substrate having one or more electronic devices formed thereon. Substrate 42 is preferably substantially made of a ceramic material (e.g., aluminum oxide, alumina, $Al_2O_3$, or aluminum nitride, AlN). Alternately, substrate 42 may be a printed circuit board made of, for example, fiberglass-epoxy printed circuit board material. Substrate 42 includes one or more layers of signal lines (i.e., interconnects) which couple a first set of bonding pads on a upper surface of substrate 42 to a second set of bonding pads on an underside of substrate 42. I/O pads on an underside of chip 40 are connected to corresponding members of the first set of bonding pads of substrate 16 using the well known controlled collapse chip connection (C4) method, commonly known as the "flip chip" method, in a region 43. After chip 40 is mounted upon substrate 42, region 43 is filled with an "underfill" material which seals the C4 connections and provides other mechanical advantages. Solder balls 44 formed upon the second set of bonding pads of substrate 42 are used to connect the second set of bonding pads to corresponding bonding pads on the component side of PCB 38 during a solder reflow operation.

Heat transfer apparatus 34 includes a cap structure 46 which is positioned between semiconductor device 36 and the ambient during use. Cap structure 46 is made out of a thermally conductive material (e.g., aluminum). Cap structure 46 includes a top surface 47 and a substantially flat bottom surface 48. Bottom surface 48 has a cavity 50 sized to receive substrate 42 of semiconductor device 36 and any decoupling capacitors 52 associated with semiconductor device 36, as decoupling capacitors 52 must be mounted in close proximity to semiconductor device 36 in order to be effective. Cavity 50 includes a substantially flat upper wall 56. In the first embodiment of heat transfer apparatus 34, upper wall 56 has a cavity 57 sized to receive chip 40 of semiconductor device 36. During use of heat transfer apparatus 34, substrate 42 of semiconductor device 36 and any decoupling capacitors 52 are positioned within cavity 50 as shown, and chip 40 of semiconductor device 36 is positioned within cavity 57 as shown.

Chip 40 of semiconductor device 36 has a substantially flat upper surface, and cavity 57 of cap structure 46 has a substantially flat upper wall 58. A first thermal interface layer 54 is positioned between the upper surface of chip 40 and upper wall 58 of cavity 57 during use, thermally coupling chip 40 to cap structure 46. First thermal interface layer 54 is preferably made of a material which changes phase (i.e., flows) to fill air pockets between the upper surface of chip 40 and upper wall 58, and to fill microscopic irregularities in the upper surface of chip 40 and the surface of upper wall 58, under a relatively small amount of pressure applied between cap structure 46 and semiconductor device 36. First thermal interface layer 54 thus achieves an acceptably low value of thermal resistance between the upper surface of chip 40 and the surface of upper wall 58 under a relatively small amount of pressure applied between cap structure 46 and semiconductor device 36.

First thermal interface layer 54 may be, for example, a layer of thermal grease or thermal wax. Thermal greases contain particles of thermally conductive material (e.g., ceramic particles) suspended in a viscous silicone or hydrocarbon fluid base. Thermal waxes contain thermally conductive particles suspended in a wax base. A suitable thermal wax is the THERMFLOW™ T705 thermal wax (Chomerics Co., Woburn, Mass.). Alternately, first thermal interface layer 54 may be a piece of thermal interface tape or a thermal interface pad which changes phase to fill air pockets and microscopic irregularities under a relatively small amount of pressure. A suitable thermal interface tape is the THERMATTACH™ T412 thermal interface tape (Chomerics Co., Woburn, Mass.).

A second thermal interface layer 59 is positioned between a region of the substantially flat upper surface of substrate 42 surrounding chip 40 and the adjoining portion of the substantially flat upper wall 56 of cavity 50 during use, thermally coupling substrate 42 to cap structure 46. Second thermal interface layer 59 is preferably made of a material which changes phase (i.e., flows) to fill air pockets between the upper surface of substrate 42 and upper wall 56, and to fillsurface of substrate 42 and in the upper surface of substrate 42 and the surface of upper wall 56, under a relatively small amount of pressure applied between cap structure 46 and semiconductor device 36. Second thermal interface layer 59 thus achieves an acceptably low value of thermal resistance between the upper surface of substrate 42 and the surface of upper wall 56 under a relatively small amount of pressure applied between cap structure 46 and semiconductor device 36.

Second thermal interface layer 59 may be, for example, a layer of thermal grease or thermal wax. Thermal greases contain particles of thermally conductive material (e.g., ceramic particles) suspended in a viscous silicone or hydrocarbon fluid base. Thermal waxes contain thermally conductive particles suspended in a wax base. A suitable thermal wax is the THERMFLOW™ T705 thermal wax (Chomerics Co., Woburn, Mass.). Alternately, second thermal interface layer 59 may be a piece of thermal interface tape or a thermal interface pad which changes phase to fill air pockets and microscopic irregularities under a relatively small amount of pressure. A suitable thermal interface tape is the THERMATTACH™ T412 thermal interface tape (Chomerics Co., Woburn, Mass.).

By thermally coupling both chip 40 and substrate 42 of semiconductor device 36 to cap structure 46, the achieved value of thermal resistance between semiconductor device 36 and cap structure 46 (i.e., $\theta_{JS}$) is substantially reduced as compared to thermally coupling only chip 40 to cap structure 46. As a result, the thermal resistance between cap structure 46 and the ambient (i.e., $\theta_{SA}$) may be increased while achieving a desired value of thermal resistance between semiconductor device 36 and the ambient. Cap structure 46 may thus remain relatively small and inexpensive. Height 63 of cap structure 46 relative to the component side of PCB 38 is substantially reduced over typical heat sinks, which is advantageous in portable applications where small and lightweight electronic systems are highly desirable.

First thermal interface layer 54 and second thermal interface layer 59 preferably achieve an acceptably low value of $\theta_{js}$ with a relatively small amount of pressure between cap structure 46 and semiconductor device 36. This relatively small amount of pressure acting upon semiconductor device 36 reduces the amount of mechanical stress created within solder balls 44 during installation. In addition, the relative positions of semiconductor device 36 and cap structure 46 are fixed during installation following application of the pressure as described below. As a result, reliability concerns involving creep of semiconductor device 36 over time are virtually eliminated.

Heat transfer apparatus 34 also preferably includes a backing plate 60 and a third thermal interface layer 62.

During use of heat transfer apparatus 34, backing plate 60 and third thermal interface layer 62 are positioned against a side of PCB 38 opposite the component side as shown in FIG. 3. Four bolts 64a–d attach cap structure 46 to backing plate 60 through corresponding holes in PCB 38. When tightened, two of the four bolts, bolts 64a and 64c, exert forces which draw cap structure 46 and backing plate 60 together and urge cap structure 46 toward semiconductor device 36. The other two bolts, bolts 64b and 64d, are installed after bolts 64a and 64c and interlock cap structure 46 and backing plate 60. This interlocking function locks in the achieved spacing between upper wall 56 of cavity 50 and the upper surface of substrate 42 of semiconductor device 36, and between upper wall 58 of cavity 57 and the upper surface of chip 40 of semiconductor device 36.

Third thermal interface layer 62 thermally couples backing plate 60 to PCB 38. Third thermal interface layer 62 is preferably patterned from a sheet of an elastomeric material containing particles of a thermally conductive material (e.g., ceramic particles). Suitable material for third thermal interface layer 62 includes the THERMATTACH™ T412 thermal interface tape (Chomerics Co., Woburn, Mass.). Alternately, third thermal interface layer 62 may be a layer of thermal grease or thermal wax.

The tightening of bolts 64a and 64c causes cap structure 46 to apply pressure upon semiconductor device 36 via first thermal interface layer 54 and second thermal interface layer 59. Semiconductor device 36 in turn applies pressure to PCB 38, causing PCB 38 to bow. Backing plate 60 provides structural support for PCB 38, preventing PCB 38 from bowing under the pressure applied by semiconductor device 36. Backing plate 60 is preferably made of a thermally conductive material (e.g., aluminum), and provides an additional heat transfer path from semiconductor device 36 to the ambient. In the additional heat transfer path, heat energy produced by semiconductor device 36 flows through PCB 38, third thermal interface layer 62, and backing plate 60 to the ambient.

Heat transfer apparatus 34 also includes a seal 66 positioned between a lip 49 in bottom surface 48 of cap structure 46, formed around the mouth of cavity 50, and the adjoining portion of the components side of PCB 38 during use. Seal 66 substantially prevents gaseous communication between cavity 50 and the ambient, preventing foreign substances (e.g., water, sand, and dust) from entering cavity 50.

Figure 4:
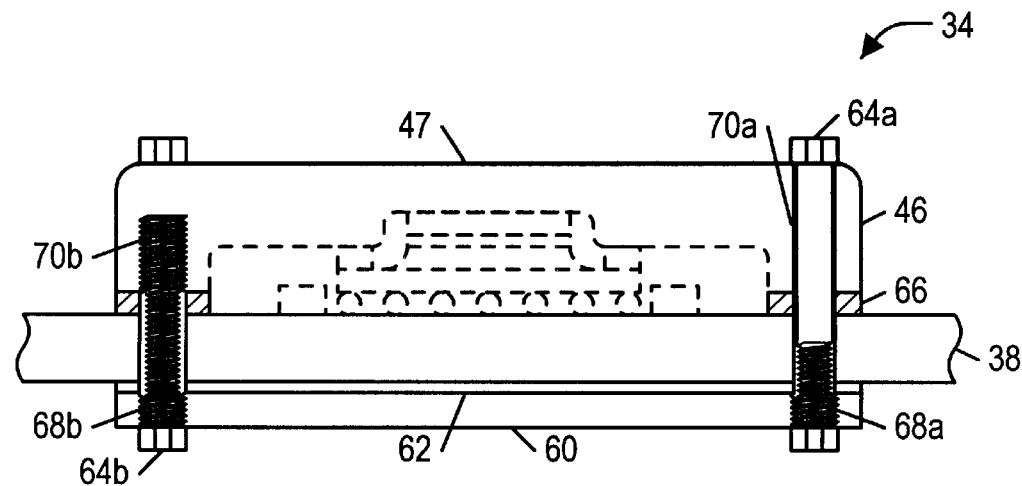
FIG. 4 is a cross-sectional view of the first embodiment of the heat transfer apparatus as viewed along cut line B—B in the direction indicated in FIG. 2, wherein two of the four bolts which attach the cap structure to the backing plate are shown, and wherein one of the two bolts shown is used to generate a force which urges the cap structure toward the semiconductor device, and wherein the other bolt shown is used to lock in an achieved spacing between the cap structure and the semiconductor device.
Figure 5:
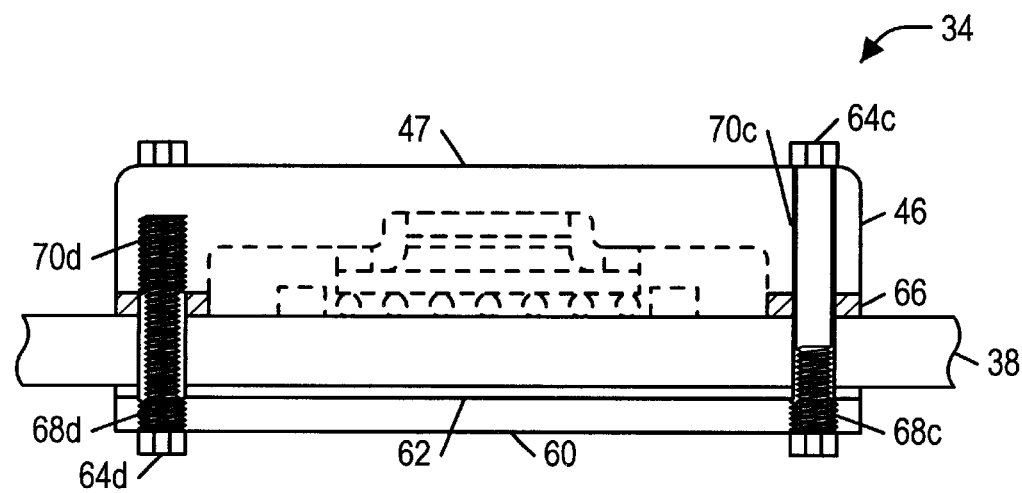
FIG. 5 is a cross-sectional view of the heat transfer apparatus of FIG. 2 as viewed along cut line C—C in the direction indicated in FIG. 2, wherein two of the four bolts which attach the cap structure to the backing plate are shown, wherein one of the two bolts shown is used to generate a force which urges the cap structure toward the semiconductor device, and wherein the other bolt shown is used to lock in an achieved spacing between the cap structure and the semiconductor device.

FIGS. 4 and 5 will now be used to further describe the components of heat transfer apparatus 34 and the installation of heat transfer apparatus 34 about semiconductor device 36. FIGS. 4 and 5 are cross-sectional views of the first embodiment of heat transfer apparatus 34 as viewed along cut lines B—B and C—C, respectively, in the directions indicated in FIG. 2. As indicated in FIG. 4, backing plate 60 includes two holes 68a and 68b threaded to receive bolts 64a and 64b, respectively. Cap structure 46 includes two holes 70a and 70b. Hole 70a is a clearance hole having smooth sides to allow bolt 64a to pass through cap structure 46, while hole 70b is threaded to receive bolt 64b. As shown in FIG. 5, backing plate 60 also includes two holes 68c and 68d threaded to receive bolts 64c and 64d, respectively. Cap structure 46 also includes two holes 70c and 70d. Hole 70c is a clearance hole having smooth sides to allow bolt 64c to pass through cap structure 46, while hole 70d is threaded to receive bolt 64d.

During installation of heat transfer apparatus 34, first thermal interface layer 54 is formed upon upper wall 58 of cavity 57 of cap structure 46. Alternately, first thermal interface layer 54 may be formed upon the upper surface of chip 40 of semiconductor device 36. Similarly, second thermal interface layer 59 is formed upon upper wall 56 of cavity 50 of cap structure 46 in the location expected to adjoin the region of the upper surface of substrate 42 surrounding chip 40. Alternately, second thermal interface layer 59 may be formed upon the region of the upper surface of substrate 42 surrounding chip 40. Cap structure 46 and seal 66 are positioned about semiconductor device 36 from the component side of PCB 38 as shown in FIGS. 1–5, and third thermal interface layer 62 and backing plate 60 are positioned about semiconductor device 36 from the side of PCB 38 opposite the component side. Bolts 64a and 64c are inserted into holes 70a and 70c, respectively, through top surface 47 of cap structure 46. Bolts 64a and 64c are then threaded into holes 68a and 68c, respectively, and tightened. Bolts 64b and 64d are threaded into holes 70b and 70d, respectively, in backing plate 60. The threading of bolts 64b and 64d is continued until bolts 64b and 64d extend into holes 70b and 70d, respectively, in cap structure 46. Bolts 64b and 64d are then tightened. Installed in this manner, bolts 64a and 64c exert a force which draws cap structure 46 and backing plate 60 together and urges cap structure 46 toward semiconductor device 36. Bolts 64b and 64d, on the other hand, serve to interlock cap structure 46 and backing plate 60. This interlocking function locks in the achieved spacing between upper wall 56 of cavity 50 and the upper surface of substrate 42 of semiconductor device 36, and between upper wall 58 of cavity 57 and the upper surface of chip 40 of semiconductor device 36.

Figure 6:
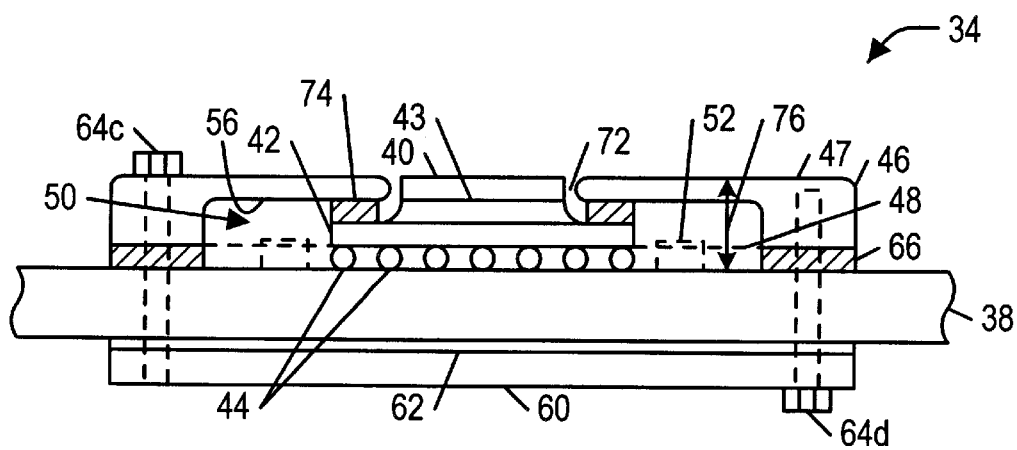
FIG. 6 is a cross-sectional view of a second embodiment of the heat transfer apparatus as viewed along cut line A-A in the direction indicated in FIG. 2, wherein only the substrate of the semiconductor device is thermally coupled to the cap structure by a thermal interface layer, and wherein the chip of the semiconductor device resides within a hole in the cap structure such that a substantially flat upper surface of the chip is exposed to the ambient.

FIG. 6 will now be used to describe a second embodiment of heat transfer apparatus 34 including a low-profile cap structure 46 thermally coupled only to substrate 42 of semiconductor device 36 during use. FIG. 6 is a cross-sectional view of the second embodiment of heat transfer apparatus 34 as viewed along cut line A—A in the direction indicated in FIG. 2. In the second embodiment, top surface 47 of cap structure 46 includes a hole 72 through which the upper surface of chip 40 is exposed to the ambient during use. As before, substantially flat bottom surface 48 of cap structure 46 has a cavity 50 sized to receive substrate 42 of semiconductor device 36. Cavity 50 may also be sized to receive substrate 42 and any decoupling capacitors 52 associated with semiconductor device 36. Hole 72 extends through cap structure 46 between the substantially flat upper wall 56 of cavity 50 and upper surface 47. During use of heat transfer apparatus 34, substrate 42 of semiconductor device 36 is positioned within cavity 50 as shown, and chip 40 of semiconductor device 36 resides within hole 72 such that the upper surface of chip 40 is exposed to the ambient.

A single thermal interface layer 74 is positioned between the region of the substantially flat upper surface of substrate 42 surrounding chip 40 and the adjoining portion of the substantially flat upper wall 56 of cavity 50 during use, thermally coupling substrate 42 to cap structure 46. Thermal interface layer 74 is preferably made of a material which changes phase (i.e., flows) to fill air pockets between the upper surface of substrate 42 and upper wall 56, and to fill microscopic irregularities in the upper surface of substrate 42 and the surface of upper wall 56, under a relatively small amount of pressure applied between cap structure 46 and semiconductor device 36. Thermal interface layer 74 thus achieves an acceptably low value of thermal resistance between the upper surface of substrate 42 and the surface of upper wall 56 under a relatively small amount of pressure applied between cap structure 46 and semiconductor device 36.

Thermal interface layer 74 may be, for example, a layer of thermal grease or thermal wax. Thermal greases contain particles of thermally conductive material (e.g., ceramic particles) suspended in a viscous silicone or hydrocarbon fluid base. Thermal waxes contain thermally conductive particles suspended in a wax base. A suitable thermal wax is the THERMFLOW™ T705 thermal wax (Chomerics Co., Woburn, Mass.). Alternately, thermal interface layer 74 may be a piece of thermal interface tape or a thermal interface pad which changes phase to fill air pockets and microscopic irregularities under a relatively small amount of pressure. A suitable thermal interface tape is the THERMATTACH™ T412 thermal interface tape (Chomerics Co., Woburn, Mass.).

By thermally coupling only substrate 42 of semiconductor device 36 to cap structure 46, the portion of cap structure 46 above chip 40 may be removed, forming a low-profile heat transfer apparatus. Height 76 of cap structure 46 relative to the component side of PCB 38 is substantially reduced over typical heat sinks and the embodiment of FIGS. 2–5, which is advantageous in portable applications. The heat transfer requirements of some applications may be met by the embodiment of FIG. 6 where cap structure 46 is relatively small and inexpensive. The thermal resistances of substrate 42 and thermal interface layer 74 impact the achieved value of thermal resistance between semiconductor device 36 and cap structure 46 (i.e., $\theta_{JS}$). Given an achieved value of $\theta_{JS}$, a suitable thermal resistance between cap structure 46 and the ambient (i.e., $\theta_{SA}$) must be attained in order to effectuate a desired value of thermal resistance between semiconductor device 36 and the ambient.

Thermal interface layer 74 preferably achieves an acceptably low value of $\theta_{JS}$ with a relatively small amount of pressure applied between cap structure 46 and semiconductor device 36. This relatively small amount of pressure reduces the amount of mechanical stress created within solder balls 44 during installation. In addition, the relative positions of semiconductor device 36 and cap structure 46 are fixed during installation following application of the pressure as described above. As a result, reliability concerns involving creep of semiconductor device 36 over time are virtually eliminated.

Figure 7:
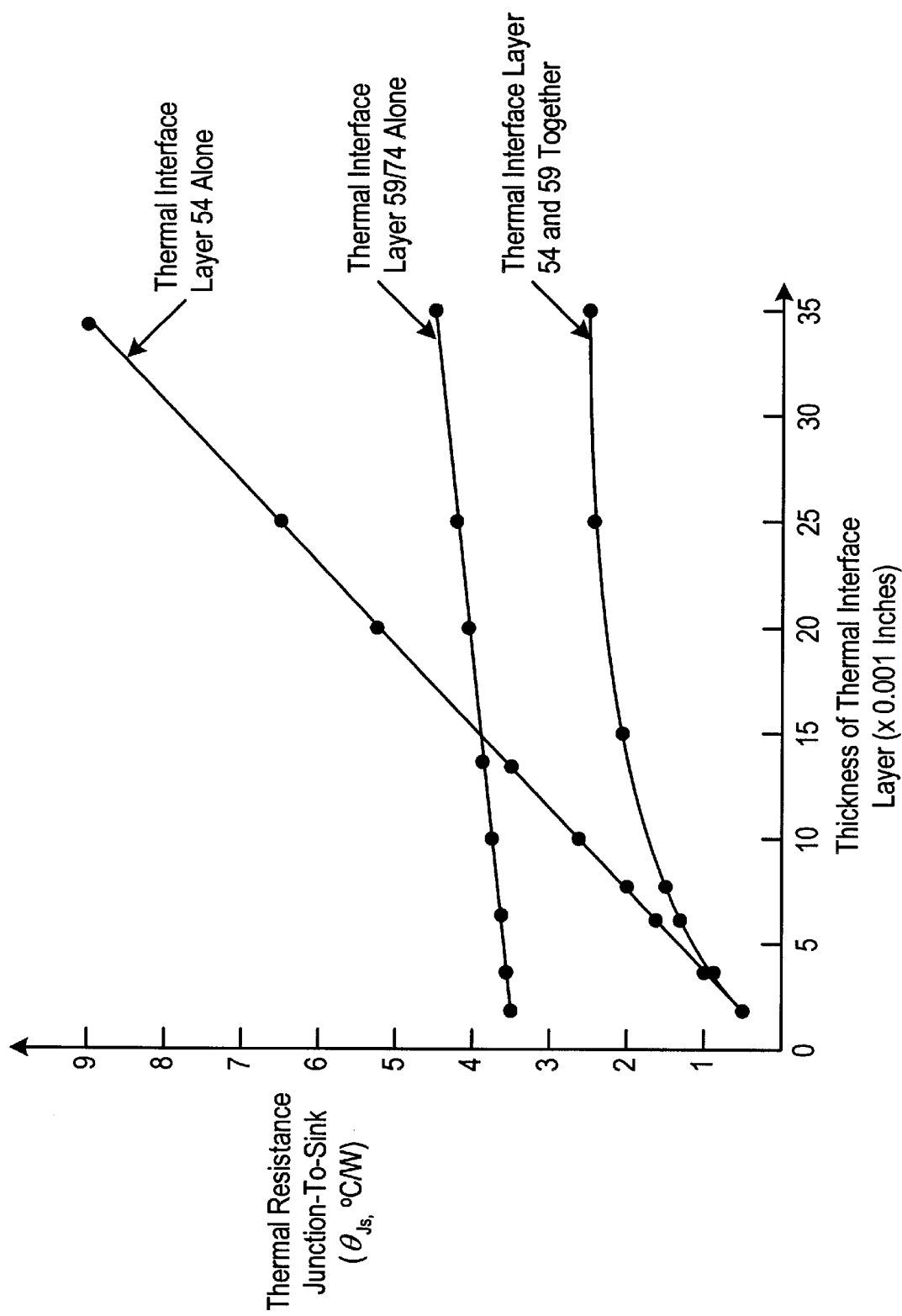
FIG. 7 is a graph of estimated thermal resistance between a typical semiconductor device junction (i.e., the chip) versus the thickness of thermal interface layers for three cases: a first case in which only the chip of the semiconductor device is thermally coupled to the cap structure by a thermal interface layer, a second case in which only the substrate of the semiconductor device is thermally coupled to the cap structure by a thermal interface layer (e.g., the second embodiment of FIG. 6), and a third case in which both the chip and the substrate of the semiconductor device are thermally coupled to the cap structure by two different thermal interface layers (i.e., the first embodiment of FIGS. 2–5).

FIG. 7 is a graph of estimated thermal resistance between a typical semiconductor device junction (i.e., chip 40) and cap structure 46 (i.e., $\theta_{JS}$) versus the thickness of thermal interface layers for three cases: a first case in which only a single thermal interface layer 54 exists between chip 40 and cap structure 46, a second case in which only a single thermal interface layer 59/74 exists between substrate 42 and cap structure 46 (e.g., the second embodiment described above), and a third case in which both thermal interface layers 54 and 59 exist between chip 40 and substrate 42, respectively, and cap structure 46 (i.e., the first embodiment described above). Factors used in the estimation include: a chip 40 having a surface area of 0.7 cm$^2$, a ceramic substrate 42 having a thickness of 0.2 cm and a surface area of 6.25 cm$^2$, C4 attachment of chip 40 to the upper surface of substrate 42, a 0.15 cm "keepout" region surrounding all edges of chip 40 which is devoid of thermal interface material, and the use of thermal interface material having a thermal conductivity of 1.5 watts per meter per degree Kelvin (W/m°K). As shown in FIG. 7, the third case including both thermal interface layers 54 and 59 (i.e., the first embodiment of the present invention) achieves the lower values of junction-to-sink thermal resistance than the other two cases using thermal interface layers 54 and 59/74 alone. The second case including only thermal interface layer 59/74 (e.g., the second embodiment of the present invention) consistently achieves higher values of junction-to-sink thermal resistance than the third case. As described above, however, the values of thermal resistance achieved using only thermal interface layer 59/74 may meet the heat transfer requirements of some applications.

It is noted that alternate embodiments may use other types of fasteners in place of bolts 64a–d such as, for example, screws, clips, clamps, or rivets. It is also noted that alternate embodiments may use two or more such fasteners to attach backing plate 60 to cap structure 46 and generate a force which urges cap structure 46 toward semiconductor device 36. Alternate embodiments may also omit backing plate 60, third thermal interface layer 62, and bolts 64a–d, and use an adhesive to attach cap structure 46 to the component side of PCB 38, simultaneously forming seal 66.

It will be appreciated by those skilled in the art having the benefit of this disclosure that this invention is believed to be a low-profile heat transfer apparatus for a surface-mounted semiconductor device employing a ball grid array device package having a chip mounted upon a substantially flat upper surface of a substrate. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A heat transfer apparatus, comprising:
   a thermally conductive cap secured directly via fasteners to a printed circuit board (PCB) about an integrated circuit and a substrate upon which the integrated circuit resides;
   said cap comprising a first lower surface elevationally lowered below a second lower surface, wherein the first lower surface is spaced a first distance above the substrate laterally outside a perimeter of the integrated circuit and the second lower surface is spaced a second distance above the integrated circuit;
   wherein the first lower surface is in thermal communication with a portion of an upper surface of the substrate a lateral distance from a perimeter of the integrated circuit; and
   wherein the second lower surface is in thermal communication iwth the integrated circuit.

2. The heat transfer apparatus as recited in claim 1, wherein said first and second lower surfaces are separated by a wall which extends along a vertical axis a lateral distance from the integrated circuit.

3. The heat transfer apparatus as recited in claim 1, wherein said first and second distances are substantially equal.

4. The heat transfer apparatus as recited in claim 1, further comprising a thermal interface layer secured in the space defined by the first distance and another thermal interface layer secured in the spaced defined by the second distance.

5. The heat transfer apparatus as recited in claim 1, wherein both of the thermal interface layers comprise a plurality of thermally conductive particles suspended in a wax base.

6. The heat transfer apparatus as recited in claim 1, wherein the first lower surface defines an upper wall of a first cavity which surrounds at least a portion of the substrate.

7. The heat transfer apparatus as recited in claim 1, wherein the second lower surface defines an upper wall of a second cavity which surrounds at least a portion of the integrated circuit.

8. The heat transfer apparatus as recited in claim 1, wherein the cap comprises aluminum.

9. The heat transfer apparatus as recited in claim 1, wherein said fastener extends through the cap and the PCB and into a backing plate configured on a side of the PCB opposite the integrated circuit.

10. The heat transfer apparatus as recited in claim 9, wherein the fastener comprises means for compressing said PCB between the cap and the backing plate.

11. The heat transfer apparatus as recited in claim 10, wherein the substrate is bonded to the PCB, the integrated circuit is bonded to the substrate, and the combination of the integrated circuit and the substrate are compressed between the cap and the PCB by the fastener.

12. The heat transfer apparatus as recited in claim 10, wherein during use the fastener exerts a force between the backing plate and the cap which urges the cap toward the integrated circuit and the substrate.

13. The heat transfer apparatus as recited in claim 9, further comprising a thermal interface layer interposed between the backing plate and the PCB for thermally coupling the PCB to the backing plate.

14. The heat transfer apparatus as recited in claim 13, wherein the thermal interface layer comprises a plurality of thermally conductive particles within an elastomeric compound.

15. A heat transfer apparatus transferring heat energy from an integrated circuit to an ambient, wherein the integrated circuit is mounted to a substrate secured to a printed circuit board (PCB), the heat transfer apparatus comprising:
   a thermally conductive cap secured directly via fasteners to the PCB between the ambient and both the integrated circuit and the substrate, wherein said cap has a first cavity and a second cavity elevationally raised above a central portion of the first cavity;
   a thermally conductive backing plate, wherein the backing plate is positioned on a side of the PCB opposite the integrated circuit;
   said fasteners also attaching the backing plate to the cap;
   a first thermal interface layer interposed between the integrated circuit and a ceiling of the second cavity, wherein the first thermal interface layer thermally couples the integrated circuit to the cap;
   a second thermal interface layer interposed between the substrate and a ceiling of the first cavity a lateral distance from a perimeter of the integrated circuit, wherein the second thermal interface layer thermally couples the substrate to the cap;
   a third thermal interface layer interposed between the backing plate and the PCB, wherein the third thermal interface layer thermally couples the PCB to the backing plate; and
   a seal, wherein the seal is interposed between a perimeter of a bottom surface of the cap and the PCB.

16. The heat transfer apparatus as recited in claim 15, wherein the seal comprises an elastomeric compound.

17. A heat transfer apparatus transferring heat energy from an integrated circuit to an ambient, wherein the integrated circuit is mounted to a substrate secured directly via fasteners to a printed circuit board (PCB), the heat transfer apparatus comprising:
   a thermally conductive cap secured to the PCB between the ambient and the substrate, wherein said cap comprises opposed top and bottom surfaces, and wherein the bottom surface comprises a cavity having a ceiling, and wherein the cap comprises a hole substantially in the center of the ceiling and extending from the ceiling to the top surface, and wherein the cap is in thermal communication with the substrate, and wherein the integrated circuit resides within the hole such that an entire upper surface of the integrated circuit is exposed to the ambient.

18. The heat transfer apparatus as recited in claim 17, wherein the ceiling is spaced a distance above the substrate laterally outside a perimeter of the integrated circuit.

19. The heat transfer apparatus as recited in claim 17, wherein the ceiling surrounds at least a portion of the substrate.

20. The heat transfer apparatus as recited in claim 17, wherein the cap comprises aluminum.

21. The heat transfer apparatus as recited in claim 17, further comprising a thermal interface layer interposed between the substrate and the ceiling a lateral distance from a perimeter of the integrated circuit.

22. The heat transfer apparatus as recited in claim 21, wherein the thermal interface layer comprises a plurality of thermally conductive particles suspended in a wax base.

23. A heat transfer apparatus transferring heat energy from an integrated circuit to an ambient, wherein the integrated circuit is mounted to a substrate secured to a printed circuit board (PCB), the heat transfer apparatus comprising:

a thermally conductive cap secured directly via fasteners to the PCB between the ambient and the substrate, wherein said cap comprises opposed top and bottom surfaces, and wherein the bottom surface comprises a cavity having a ceiling, and wherein the cap comprises a hole substantially in the center of the ceiling and extending from the ceiling to the top surface, and wherein the cap is in thermal communication with the substrate, and wherein the integrated circuit resides within the hole such that an upper surface of the integrated circuit is exposed to the ambient;

a backing plate, wherein the backing plate is positioned on a side of the PCB opposite the integrated circuit; and said fasteners also attaching the backing plate to the cap.

24. A heat transfer apparatus transferring heat energy from an integrated circuit to an ambient, wherein the integrated circuit is mounted to a substrate secured to a printed circuit board (PCB), the heat transfer apparatus comprising:

a thermally conductive cap secured directly via fasteners to the PCB between the ambient and the substrate, wherein said cap comprises opposed top and bottom surfaces, and wherein the bottom surface comprises a cavity having a ceiling, and wherein the cap comprises a hole substantially in the center of the ceiling and extending from the ceiling to the top surface, and wherein the integrated circuit resides within the hole such that an upper surface of the integrated circuit is exposed to the ambient;

a backing plate, wherein the backing plate is positioned on a side of the PCB opposite the integrated circuit;

said fasteners also attaching the backing plate to the cap;

a first thermal interface layer interposed between the substrate and the ceiling a lateral distance from a perimeter of the integrated circuit, wherein the first thermal interface layer thermally couples the substrate to the cap;

a second thermal interface layer interposed between the backing plate and the PCB, wherein the second thermal interface layer thermally couples the PCB to the backing plate; and a seal, wherein the seal is interposed between a perimeter of the bottom surface of the cap and the PCB.

25. The heat transfer apparatus as recited in claim 24, wherein the seal comprises an elastomeric compound.

* * * * *

UNITED STATES PATENT AND TRADEMARK OFFICE
CERTIFICATE OF CORRECTION

PATENT NO. : 5,907,474

DATED : May 25, 1999

INVENTOR(S) : Dolbear

It is certified that error appears in the above-indentified patent and that said Letters Patent is hereby corrected as shown below:

In the Claims:

Claim 1, col. 15, line 47, please delete "iwth" and substitute therefor --with--.

Signed and Sealed this

Fifth Day of October, 1999

Attest:

Q. TODD DICKINSON

Attesting Officer

Acting Commissioner of Patents and Trademarks